(12) United States Patent
Lo

(10) Patent No.: US 8,440,477 B1
(45) Date of Patent: May 14, 2013

(54) METHOD FOR MANUFACTURING LED

(75) Inventor: Hsing-Fen Lo, Hsinchu (TW)

(73) Assignee: Advanced Optoelectronic Technology, Inc., Hsinchu Hsien (TW)

(*) Notice: Subject to any disclaimer, the term of this patent is extended or adjusted under 35 U.S.C. 154(b) by 0 days.

(21) Appl. No.: 13/586,827

(22) Filed: Aug. 15, 2012

(30) Foreign Application Priority Data

Dec. 27, 2011 (CN) .......................... 2011 1 0443709

(51) Int. Cl.
*H01L 21/00* (2006.01)
(52) U.S. Cl.
USPC ................... 438/23; 438/22; 438/26; 438/42; 438/46; 438/108; 257/79; 257/81; 257/88; 257/89; 257/99; 257/E21.499
(58) Field of Classification Search .................. None
See application file for complete search history.

(56) References Cited

U.S. PATENT DOCUMENTS 6,869,813 B2 * 3/2005 Okazaki ........................ 438/22

* cited by examiner

*Primary Examiner* — Kyoung Lee
(74) *Attorney, Agent, or Firm* — Altis Law Group, Inc.

(57) ABSTRACT

A method for manufacturing an LED (light emitting diode) includes following steps: providing a first electrode, a second electrode and a Zener diode, the Zener diode being electrically connected to the first and second electrodes; providing a mold; the first electrode, the second electrode and the Zener diode being received in the mold; injecting a liquid molding material into the mold, thereby integrally forming a base, a dam, and a reflective cup, the Zener diode being encapsulated in the dam; setting first and second LED chips respectively on the first and second electrodes; filling an encapsulation material in the reflective cup to encapsulate the first and second LED chips. The first and second LED chips are separated from each other by the dam.

16 Claims, 9 Drawing Sheets

METHOD FOR MANUFACTURING LED

BACKGROUND

1. Technical Field

The disclosure relates a method for manufacturing an LED (light emitting diode), and particularly to a method for manufacturing an LED which has a dam separating LED chips of the LED.

2. Discussion of Related Art

Light emitting diodes' (LEDs) many advantages, such as high luminosity, low operational voltage, low power consumption, compatibility with integrated circuits, easy driving, long term reliability, and environmental friendliness have promoted their wide use as a lighting source.

A typical LED includes a base, first and second electrodes secured to the base, a plurality of LED chips arranged on the base and electrically connected to the first and second electrodes, and a projection arranged on the base and surrounding the LED chips. The projection is used to receive an encapsulation therein, which covers the LED chips and to function as a reflector for reflecting light from the LED chips. However, the projection and the base which are separate parts, are formed in different steps. Therefore, the method for manufacturing the typical LED is complicated, and the manufacturing cost thereof is increased. Furthermore, light rays generated by the LED chips of the LED interfere with each other, whereby color of light generated by the LED is difficult to control and accordingly the LED has a low color rendering index (CRI).

Therefore, what is needed is a method for manufacturing an LED which can overcome the described limitations.

BRIEF DESCRIPTION OF THE DRAWINGS

Many aspects of the disclosure can be better understood with reference to the following drawing. The components in the drawing are not necessarily drawn to scale, the emphasis instead being placed upon clearly illustrating the principles of the present light emitting diode package for microminiaturization. Moreover, in the drawing, like reference numerals designate corresponding parts throughout the whole view.

DETAILED DESCRIPTION OF EMBODIMENTS

Figure 1:
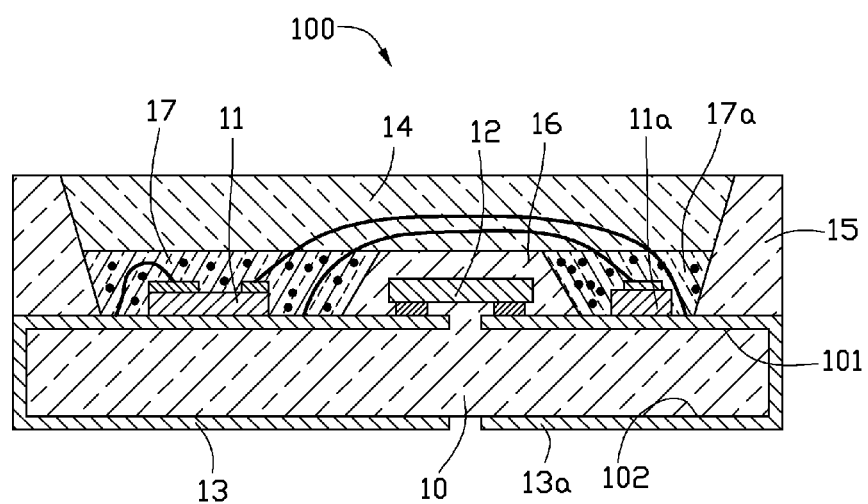
FIG. 1 is a cross-sectional view of an LED in accordance with the present disclosure.

FIG. 1 shows an LED 100 including a base 10, two LED chips 11, 11a, a Zener diode 12, a first electrode 13, a second electrode 13a, an encapsulation layer 14, a dam 16, and an annular reflective cup 15. The dam 16 and the reflective cup 15 are integrally formed with the base 10 as a single piece.

The base 10 includes a first face 101 and a second face 102 opposite to the first face 101.

A cross-section of each of the first and second electrodes 13, 13a is U-shaped. The first and second electrodes 13, 13a are separated from each other. An opening of the first electrode 13 faces an opening of the second electrode 13a. The first and second electrodes 13, 13a are horizontally arranged on the base 10. One end of each of the first and second electrodes 13, 13a contacts the first face 101 of the base 10; another end of each of the first and second electrodes 13, 13a contacts the second face 102 of the base 10.

The LED chips 11, 11a are disposed on the first and second electrodes 13, 13a respectively. The anodes of the LED chips 11, 11a are electrically connected to the second electrode 13a. The cathodes of the LED chips 11, 11a are electrically connected to the first electrode 13.

The reflective cup 15 surrounds the LED chips 11, 11a for reflecting light beams emitted from the LED chips 11, 11a and is located at an outer periphery of the base 10.

The dam 16 divides a space surrounded by the reflective cup 15 into two parts. The LED chip 11 is separated from the LED chip 11a by the dam 16. A height of the dam 16 is smaller than that of the reflective cup 15, and larger than that of each of the LED chips 11, 11a. The dam 16 is used to prevent interference of the light beams from the LED chips 11, 11a, which are different type LED chips respectively emitting light beams of short wavelength (for example, blue light) and long wavelength (for example, red light). In addition, the dam 16 is used as an additional reflector for increasing the light extracting efficiency of the LED 100. The Zener diode 12 is encapsulated in the dam 16, whereby the light beams generated by the LED chips 11, 11a will not be absorbed by the Zener diode 12 so that the light extracting efficiency of the LED 100 can be further promoted.

A first phosphor layer 17 and a second phosphor layer 17a are received in the spaces between the reflective cup 15 and the dam 16 to respectively cover the LED chips 11, 11a. The height of the dam 16 is equal to that of each of the first and second phosphor layers 17, 17a. A top face of each of the first and second phosphor layers 17, 17a is coplanar with a top surface of the dam 16. The first and second phosphor layers 17, 17a are distinct from each other in composition.

The encapsulation layer 14 is received in the reflective cup 15 to cover the first and second LED chips 11, 11a, the dam 16 and the first and second phosphor layers 17, 17a. The encapsulation layer 14 is transparent to light. A top face of the encapsulation layer 14 is coplanar with a top surface of the reflective cup 15.

Figure 2:
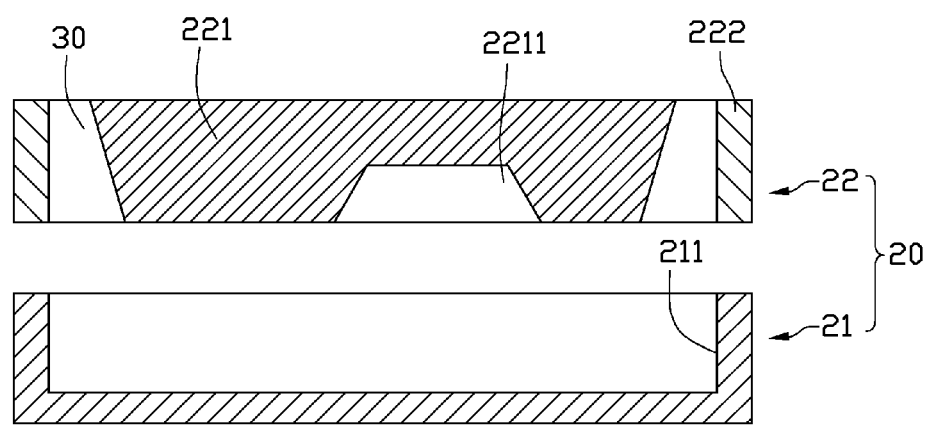
FIGS. 2-3 are cross-sectional views of molds for manufacturing the LED of FIG. 1.

FIG. 2 shows a mold 20 for manufacturing the LED 100. The mold 20 includes a bottom die 21 and an upper die 22. The bottom die 21 defines a rectangular receiving groove 211 in a top surface thereof. The upper die 22 includes a core component 221 and a wall 222. An upper face and a bottom face of the core component 221 are respectively coplanar with an upper face and a bottom face of the wall 222. A cross-sectional view of the core component 221 is trapeziform, and a width of the core component 221 gradually decreases along a top-to-bottom direction. A notch 2211 is defined in the bottom face of the core component 221. A cross-section of the notch 2211 is trapezeform, and a width of the notch 2211 is gradually increased along the top-to-bottom direction.

Figure 3:
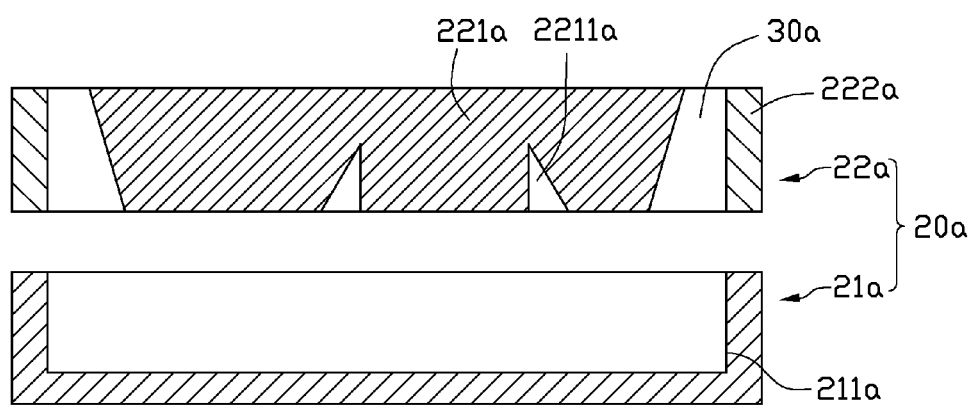

FIG. 3 shows another mold 20a for manufacturing the LED 100. The mold 20a is similar to the mold 20 shown in FIG. 2 in structure, and also includes a bottom die 21a and an upper die 22a. The bottom die 21a defines a rectangular receiving groove 211a in a top surface thereof. The upper die 22a includes a core component 221a and a wall 222a. Differences between the mold 20a and the mold 20 shown in FIG. 2 are in that: an annular notch 2211a is defined in a bottom face of the core component 221a of the mold 20a; a cross-section of the notch 2211a is triangular.

Figure 4:
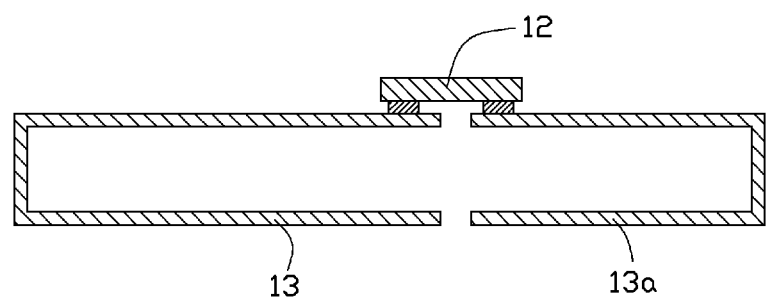
FIGS. 4-6 are cross-sectional views showing different steps of a method for manufacturing the LED of FIG. 1, in accordance with a first embodiment of the present disclosure.
Figure 5:
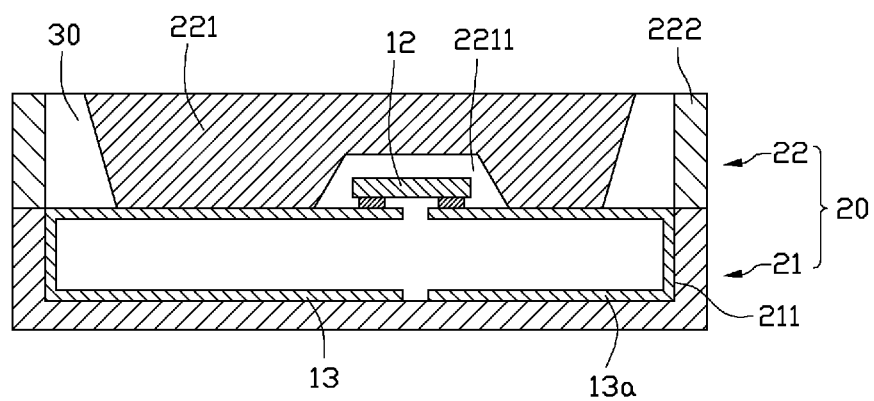
Figure 6:
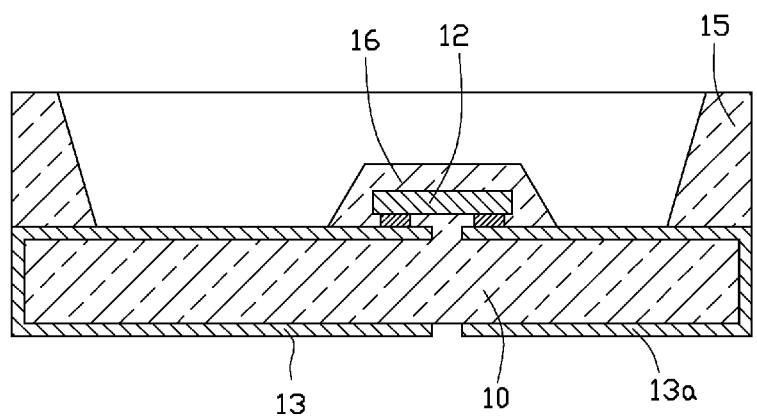

Referring to FIGS. 4-6, a method for manufacturing the above LED 100 in accordance with a first embodiment is provided, which includes the following steps.

Referring to FIG. 4, the first step is to provide the first and second electrodes 13, 13a and the Zener diode 12. The anode and the cathode of the Zener diode 12 are electrically connected to the first and second electrodes 13, 13a respectively.

Referring to FIG. 5, the second step is to provide the mold 20 and place the first and second electrodes 13, 13a and the Zener diode 12 in the receiving groove 211 of the bottom die 21. The top face of the bottom die 21 is coplanar with an upper face of the first electrode 13 and an upper face of the second electrode 13a. The core component 221 of the upper die 22 is placed on the first and second electrodes 13, 13a. The Zener diode 12 is received in the notch 2211 of the core component 221. The notch 2211 of the core component 221 communicates with a gap between the first electrode 13 and the second electrode 13a. The wall 222 of the upper die 22 is put on the bottom die 21. The wall 222 surrounds and is spaced from the core component 221. An annular sprue 30 is defined between the core component 221 and the wall 222. The sprue 30 has a width gradually increased along the top-to-bottom direction.

The third step is to inject a liquid molding material (molten polymer material, for example) into the mold 20. In detail, the liquid molding material is injected into the receiving groove 211 of the bottom die 21 via the sprue 30 between the wall 222 and the core component 221 of the upper die 22. The liquid molding material fills in the receiving groove 211 and then flows to the notch 2211. The liquid molding material is continuously injected into the sprue 30 until the receiving groove 211, the notch 2211 and the sprue 30 are filled with the liquid molding material. An upper face of the liquid molding material filled in the sprue 30 is coplanar with the upper face of the upper die 22.

Referring to FIG. 6, the fourth step is to solidify the liquid molding material and remove the upper die 22 and the bottom die 21 from the solidified molding material, thereby integrally forming the base 10, the dam 16 and the reflective cup 15. The solidified molding material in the receiving groove 211 of the bottom die 21 forms the base 10. The solidified molding material in the sprue 30 forms the reflective cup 15. The solidified molding material in the notch 2211 of the core component 221 forms the dam 16. The Zener diode 12 is encapsulated in the dam 16.

Referring to FIG. 1 again, the fifth step is to secure the first LED chip 11 on the first electrode 13 and the second LED chip 11a on the second electrode 13a. The cathodes of the LED chips 11, 11a are electrically connected to the first electrode 13 via wires. The anode of the LED chip 11 is electrically connected to the second electrode 13a via a wire, while the anode of the LED chip 11a is directly mounted to the second electrode 13a.

The sixth step is to form the first phosphor layer 17 on the first electrode 13 and the second phosphor layer 17a on the second electrode 13a. The first phosphor layer 17 covers the LED chip 11. The second phosphor layer 17a covers the LED chip 11a.

The seventh step is to form the encapsulation layer 14 in the reflective cup 15 to encapsulate the first and second LED chips 11, 11a.

According to the disclosure, the dam 16 and the reflective cup 15 are integrally formed with the base 10 as a single piece. Therefore, the method for manufacturing the LED 100, particularly for manufacturing the base 10, the reflective cup 15 and the dam 16 is easier, and the manufacturing cost is reduced, compared with the conventional manufacturing method. The dam 16 prevents light rays from the LED chips 11, 11a from interfering with each other to a certain degree, whereby color of light generated by the LED 100 is easier to control; thus, the LED 100 can have a better CRI. In addition, the first and second phosphor layers 17, 17a which have different compositions are separated from each other by the dam 16, whereby the first and second phosphor layers 17, 17a can be fully dedicated to the conversions of colors of light rays from the LED chips 11, 11a, respectively. Thus, the CRI of the LED 100 can be further improved. Moreover, since the base 10, the reflective cup 15 and the dam 16 are injection molded with the first and second electrodes 13, 13a, an integrity of the LED 100 is improved whereby reliability of the LED 100 can be improved.

Figure 7:
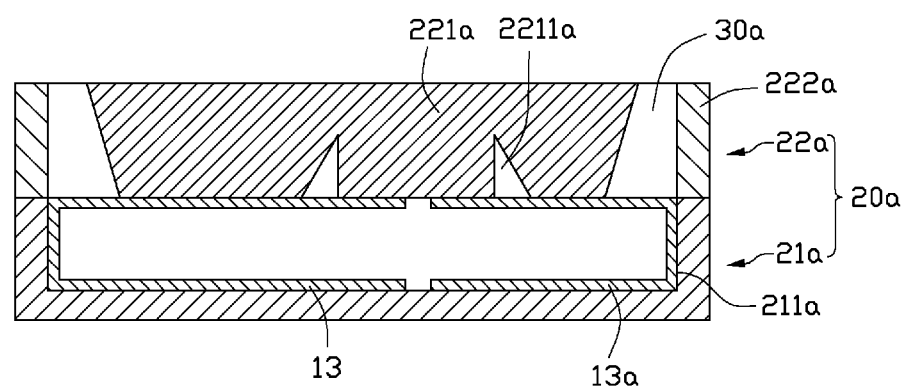
FIGS. 7-9 are cross-sectional views showing different steps of a method for manufacturing the LED of FIG. 1, in accordance with a second embodiment of the present disclosure.
Figure 8:
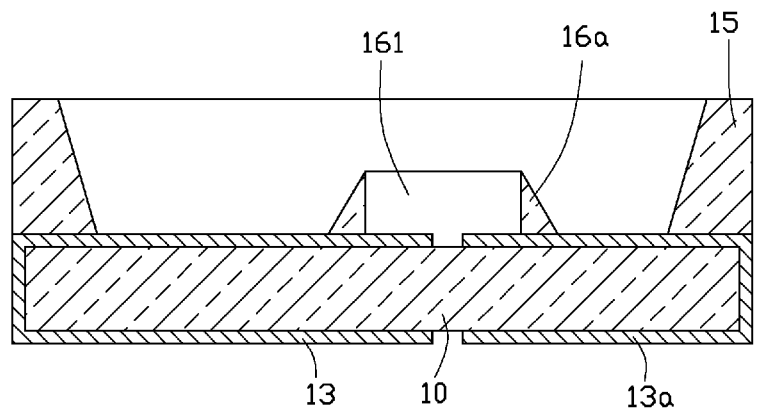
Figure 9:
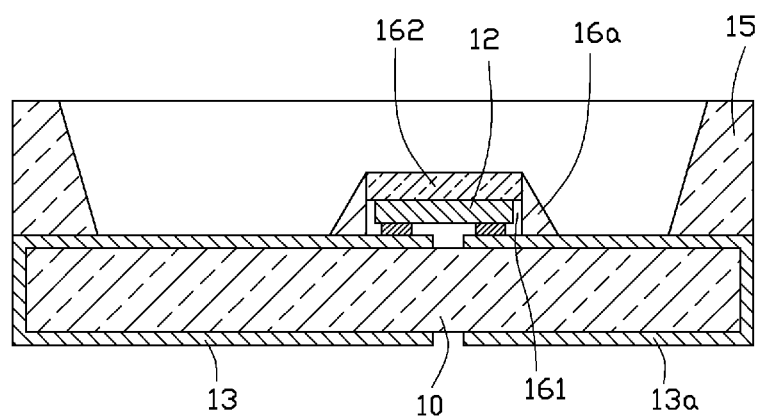

Referring to FIGS. 7-9, a method for manufacturing the LED 100 in accordance with a second embodiment is provided, which includes the following steps.

The first step is to provide the first and second electrodes 13, 13a.

Referring to FIG. 7, the second step is to provide the mold 20a and place the first and second electrodes 13, 13a in the mold 20a. In detail, the first and second electrodes 13, 13a are separately received in the receiving groove 211a of the bottom die 21a. The top face of the bottom die 21a is coplanar with an upper face of the first electrode 13 and an upper face of the second electrode 13a. The core component 221a of the upper die 22a is put on the first and second electrodes 13, 13a. The notch 2211a of the core component 221a communicates with a gap between the first electrode 13 and the second electrode 13a. The wall 222a of the upper die 22a is put on the bottom die 21a. The wall 222a surrounds and is spaced from the core component 221a. An annular sprue 30a is defined between the core component 221a and the wall 222a. The sprue 30a has a width gradually increased along the top-to-bottom direction.

The third step is to inject a liquid molding material (molten polymer material, for example) into the mold 20a. In detail, the liquid molding material is injected into the receiving groove 211a of the bottom die 21a via the sprue 30a between the wall 222a and the core component 221a of the upper die 22a. The liquid molding material fills in the receiving groove 211a and then flows to the notch 2211a. The liquid molding material is continuously injected into the sprue 30a until the receiving groove 211a, the notch 2211a and the sprue 30a are filled with the liquid molding material. An upper face of the liquid molding material filled in the sprue 30a is coplanar with the upper face of the upper die 22a.

Referring to FIG. 8, the fourth step is to solidify the liquid molding material and remove the upper die 22a and the bottom die 21a from the solidified molding material, thereby integrally forming the base 10, the dam 16a and the reflective cup 15 with the first and second electrodes 13, 13a. The solidified molding material in the receiving groove 211a of the bottom die 21a forms the base 10. The solidified molding material in the sprue 30a forms the reflective cup 15. The solidified molding material in the notch 2211a of the core component 221a forms the dam 16a. The dam 16a has an opening 161.

Referring to FIG. 9, the fifth step is to put the Zener diode 12 in the opening 161 of the dam 16a. The anode and the cathode of the Zener diode 12 are electrically connected to the first and second electrodes 13, 13a respectively. A covering layer 162 covers the opening 161 of the dam 16a to seal the Zener diode 12 in the dam 16a.

Referring to FIG. 1, the sixth step is to secure the first LED chip 11 on the first electrode 13 and the second LED chip 11a on the second electrode 13a. The cathodes of the LED chips 11, 11a are electrically connected to the first electrode 13 via wires. The anode of the LED chip 11 is electrically connected to the second electrode 13a via a wire, while the anode of the LED chip 11a is directly mounted to the second electrode 13a.

The seventh step is to form the first phosphor layer 17 on the first electrode 13 and the second phosphor layer 17a on the second electrode 13a. The first phosphor layer 17 covers the LED chip 11. The second phosphor layer 17a covers the LED chip 11a.

The eighth step is to form the encapsulation layer 14 in the reflective cup 15 to encapsulate the first and second LED chips 11, 11a.

It is to be further understood that even though numerous characteristics and advantages have been set forth in the foregoing description of embodiments, together with details of the structures and functions of the embodiments, the disclosure is illustrative only; and that changes may be made in detail, especially in matters of shape, size, and arrangement of parts within the principles of the disclosure to the full extent indicated by the broad general meaning of the terms in which the appended claims are expressed.

What is claimed is:

1. A method for manufacturing an LED, comprising:
   providing a first electrode, a second electrode and a Zener diode, and electrically connecting the Zener with the first electrode and the second electrode;
   providing a mold, the mold comprising an upper die and a bottom die, the bottom die defining a receiving groove in a top surface thereof, the upper die comprising a core component and a wall around the core component, the core component defining a notch in a bottom surface thereof;
   putting the first electrode, the second electrode and the Zener diode in the receiving groove of the bottom die, the core component of the upper die being put on the first and second electrodes, the Zener diode being received in the notch of the core component, the wall of the upper die being put on the bottom die, the wall surrounding and being spaced from the core component, a sprue being defined between the core component and the wall;
   injecting a liquid molding material into the receiving groove of the bottom die through the sprue, until the receiving groove, the notch and the sprue are filled with the liquid molding material;
   solidifying the liquid molding material and removing the upper die and the bottom die from the solidified molding material to integrally form a base, a dam and a reflective cup, the solidified molding material in the receiving groove of the bottom die forming the base, the solidified molding material in the sprue forming the reflective cup, the solidified molding material in the notch of the core component forming the dam, the Zener diode being encapsulated in the dam;
   setting a first LED chip on the first electrode and a second LED chip on the second electrode and electrically connecting the first and second LED chips with the first and second electrodes; and
   forming an encapsulation layer in the reflective cup to encapsulate the first and second LED chips.

2. The method of claim 1, wherein the first and second electrodes are U-shaped and horizontally positioned, and an opening of the first electrode faces an opening of the second electrode.

3. The method of claim 1, further comprising forming a first phosphor layer on the first electrode and a second phosphor layer on the second electrode immediately before the step of forming an encapsulation layer in the reflective cup, the first phosphor layer covering the first LED chip, the second phosphor layer covering the second LED chip, the first phosphor layer being separated from the second phosphor layer by the dam, the first and second phosphor layers having compositions different from each other.

4. The method of claim 3, wherein a height of the dam is equal to that of each of the first and second phosphor layers.

5. The method of claim 1, wherein a height of the dam is smaller than that of the reflective cup, and larger than that of each of the first and second LED chips.

6. The method of claim 1, wherein the core component comprises an upper surface opposite to the bottom surface, a cross-sectional view of the notch being trapezeform, a width of the notch being gradually decreased along a direction from the bottom surface to the upper surface.

7. The method of claim 1, wherein the core component comprises an upper surface opposite to the bottom surface, a cross-sectional view of the core component being trapezeform, a width of the core component being gradually decreased from the upper surface to the bottom surface.

8. The method of claim 1, wherein a top face of the bottom die is coplanar with an upper face of the first electrode and an upper face of the second electrode.

9. A method for manufacturing an LED, comprising:
   providing a first electrode and a second electrode, the first and second electrodes being separated from each other;
   providing a mold, the mold comprising an upper die and a bottom die, the bottom die defining a receiving groove in a top surface thereof, the upper die comprising a core component and a wall around the core component, the core component defining a notch in a bottom surface thereof;
   putting the first electrode and the second electrode in the receiving groove of the bottom die, the core component of the upper die being put on the first and second electrodes, the wall of the upper die being put on the bottom die, the wall surrounding and being spaced from the core component, a sprue being defined between the core component and the wall;
   injecting a liquid molding material into the receiving notch of the bottom die through the sprue between the wall and the core component until the receiving groove, the notch and the sprue are filled with the liquid molding material;
   solidifying the liquid molding material and removing the upper die and the bottom die from the solidified molding material to integrally form a base, a dam and a reflective cup, the solidified molding material in the receiving groove of the bottom die forming the base, the solidified molding material in the sprue forming the reflective cup, the solidified molding material in the notch of the core component forming the dam, the dam having an opening;
   providing a Zener diode, putting the Zener diode in the opening of the dam, electrically connecting the Zener with the first electrode and the second electrode;
   providing a covering layer to cover the opening of the dam and seal the Zener diode in the dam;
   setting a first LED chip on the first electrode and a second LED chip on the second electrode and electrically connecting the first and second LED chips with the first and second electrodes; and
   forming an encapsulation layer in the reflective cup to encapsulate the first and second LED chips.

10. The method of claim 9, wherein the first and second electrodes are U-shaped and horizontally positioned, and an opening of the first electrode faces an opening of the second electrode.

11. The method of claim 9, further comprising forming a first phosphor layer on the first electrode and a second phosphor layer on the second electrode immediately before the step of forming an encapsulation layer in the reflective cup, the first phosphor layer covering the LED chip, the second phosphor layer covering the LED chip, the first phosphor layer being separated from the second phosphor layer by the dam.

12. The method of claim 11, wherein a height of the dam is equal to that of each of the first and second phosphor layers.

13. The method of claim 9, wherein a height of the dam is smaller than that of the reflective cup, and larger than that of each of the first and second LED chips.

14. The method of claim 9, wherein the core component comprises an upper surface opposite to the bottom surface, a cross-sectional view of the core component being trapeze-form, a width of the core component being gradually decreased from the upper surface to the bottom surface.

15. The method of claim 9, wherein a top face of the bottom die is coplanar with an upper face of the first electrode and an upper face of the second electrode.

16. The method of claim 9, wherein the first LED chip is separated from the second LED chip by the dam.

\* \* \* \* \*